(12) United States Patent
Li (10) Patent No.: US 10,002,756 B2
(45) Date of Patent: Jun. 19, 2018

(54) FIN-FET DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days. days.

(21) Appl. No.: 15/243,775

(22) Filed: Aug. 22, 2016

(65) Prior Publication Data

US 2017/0162383 A1    Jun. 8, 2017

(30) Foreign Application Priority Data

Dec. 7, 2015 (CN) .......................... 2015 1 0894291

(51) Int. Cl.
*H01L 21/02* (2006.01)
*H01L 21/324* (2006.01)
(Continued)

(52) U.S. Cl.
CPC ...... *H01L 21/02236* (2013.01); *H01L 21/324* (2013.01); *H01L 21/823431* (2013.01);
(Continued)

(58) Field of Classification Search
CPC ........... H01L 21/02236; H01L 27/0886; H01L 29/517; H01L 21/823462;
(Continued)

(56) References Cited

U.S. PATENT DOCUMENTS

2003/0049942 A1    3/2003  Haukka
2003/0219972 A1    11/2003  Green
(Continued)

*Primary Examiner* — Moin Rahman
(74) *Attorney, Agent, or Firm* — Anova Law Group, PLLC (57) ABSTRACT

A method for fabricating a Fin-FET device includes forming a plurality of discrete fin structures on a substrate with a bottom portion of the sidewall surfaces covered in an isolation layer, and forming a dielectric layer on the isolation layer and the fin structures with an opening formed across the fin structures and exposing a portion of the isolation layer and the fin structures. The method further includes forming a first oxidation layer on the exposed surfaces of the fin structures, and then forming a second oxidation layer between the first oxidation layer and the surfaces of the fin structures through a first annealing process. The method then includes forming a gate dielectric layer on the first oxidation layer, forming a sacrificial adsorption layer on the gate dielectric layer, performing a second annealing process, and then forming a gate electrode layer to fill the opening formed in the dielectric layer.

18 Claims, 8 Drawing Sheets

(51) Int. Cl.
*H01L 29/06* (2006.01)
*H01L 29/78* (2006.01)
*H01L 29/66* (2006.01)
*H01L 21/8234* (2006.01)
*H01L 29/51* (2006.01)
*H01L 27/088* (2006.01)

(52) U.S. Cl.
CPC .. *H01L 21/823462* (2013.01); *H01L 27/0886* (2013.01); *H01L 29/0649* (2013.01); *H01L 29/517* (2013.01); *H01L 29/66545* (2013.01); *H01L 29/66795* (2013.01); *H01L 29/785* (2013.01)

(58) Field of Classification Search
CPC ....... H01L 21/823431; H01L 29/66545; H01L 29/785; H01L 29/0649; H01L 21/324; H01L 29/66795

USPC ........ 438/136, 137, 455–458, 149–165, 173, 438/192, 206, 212, 424, 427, 428, 591; 257/20, 194, 135–136, 213–413, 900, 257/902–903

See application file for complete search history.

(56) References Cited

U.S. PATENT DOCUMENTS

| | | |
|---|---|---|
| 2005/0215070 A1 | 9/2005 | Kobayashi et al. |
| 2010/0219481 A1 | 9/2010 | Tseng et al. |
| 2012/0280288 A1 | 11/2012 | Ando et al. |
| 2014/0141598 A1 | 5/2014 | Ando et al. |
| 2014/0252492 A1 | 9/2014 | Frank et al. |
| 2015/0132937 A1 | 5/2015 | Kim et al. |
| 2016/0197004 A1* | 7/2016 | Akarvardar ....... H01L 21/76202 257/509 |

* cited by examiner

FIN-FET DEVICE AND FABRICATION METHOD THEREOF

CROSS-REFERENCES TO RELATED APPLICATIONS

This application claims the priority of Chinese Patent Application No. CN201510894291.8, filed on Dec. 7, 2015, the entire content of which is incorporated herein by reference.

FIELD OF THE DISCLOSURE

The present disclosure generally relates to the field of semiconductor fabrication technology and, more particularly, relates to a Fin-FET device and fabrication method thereof.

BACKGROUND

In order to meet the miniaturization and integration requirements for future integrated circuits (ICs), the rapid development of IC manufacturing technology has continuously reduced the sizes of semiconductor devices in ICs. Specifically, the dimensions of metal oxide semiconductor (MOS) devices have been steadily reduced. Transistor is one of the important components in MOS devices.

With continuous decrease in the size of semiconductor devices, conventional dielectric layer made of $SiO_x$ or SiON may not be able to meet the performance requirements for semiconductor devices. In particular, transistors containing a dielectric layer of $SiO_x$ or SiON may demonstrate a variety of problems, such as current leakage, impurity diffusion, etc. Such problems may affect the threshold voltage of the transistor and may further reduce the reliability and the stability of the transistor.

To solve these problems, a transistor comprising a high-k dielectric layer and a metal gate, i.e. a high-k metal gate (HKMG) transistor, has been proposed. The HKMG transistor replaces conventional $SiO_x$ or SiON with a high-k dielectric material for the dielectric layer. In addition, the HKMG transistor also replaces conventional polycrystalline silicon with a metal or a metal compound for the formation of the gate electrode. With a reduced size, the HKMG transistor may demonstrate a series advantages, such as low current leakage, low operation voltage, low energy consumption, etc. Therefore, the performance of the transistor may be improved.

However, together with the decrease in the size of semiconductor devices, undesired influence of the high-k dielectric layer and the metal gate on the semiconductor devices may also become severe. The disclosed Fin-field effect transistor (Fin-FET) device and the fabrication methods are directed to solve one or more problems set forth above and other problems in the art.

BRIEF SUMMARY OF THE DISCLOSURE

One aspect of the present disclosure includes a method for fabricating a Fin-FET device. The method includes forming a plurality of discrete fin structures and an isolation layer on a substrate. The plurality of fin structures are separated from each other by the isolation layer, the isolation layer covers a bottom portion of sidewall surfaces of each fin structure, and the top surface of the isolation layer is lower than the top surface of the fin structures. The method also includes forming a dielectric layer on a portion of the isolation layer and also on a portion of sidewall and top surfaces of the plurality of fin structures. An opening formed across the plurality of fin structures in the dielectric layer exposes the other portion of sidewall and top surfaces of the plurality of fin structures. The method further includes forming a first oxidation layer on the exposed portion of sidewall and top surfaces of each fin structure through an oxidation process, forming a second oxidation layer between the first oxidation layer and the sidewall and the top surfaces of each fin structure through a first annealing process, forming a gate dielectric layer on the first oxidation layer, forming a sacrificial adsorption layer on the gate dielectric layer, performing a second annealing process after forming the sacrificial adsorption layer, and then forming a gate electrode layer to fill the opening formed in the dielectric layer.

Another aspect of the present disclosure provides a Fin-FET device. The Fin-FET device includes a plurality of discrete fin structures and an isolation layer formed on a substrate. The plurality of fin structures are separated from each other by the isolation layer, the isolation layer covers a bottom portion of sidewall surfaces of each fin structure, and a top surface of the isolation layer is lower than a top surface of the fin structures. The Fin-FET device also includes a dielectric layer formed on a portion of the isolation layer and also on a portion of sidewall and top surfaces of the plurality of fin structures. An opening formed across the plurality of fin structures in the dielectric layer exposes the other portion of sidewall and top surfaces of the plurality of fin structures. The Fin-FET further includes a first oxidation layer and a second oxidation layer covering the portion of sidewall and top surfaces of the fin structures exposed by the opening formed in the dielectric layer. The second oxidation layer is formed between the first oxidation layer and the sidewall and the top surfaces of each fin structure through a first annealing process performed after forming the first oxidation layer through an oxidation process. Finally, the Fin-FET includes a gate dielectric layer formed on the first oxidation layer and a gate electrode layer formed on the gate dielectric layer. Prior to the formation of the gate electrode layer, a sacrificial adsorption layer is formed on the gate dielectric layer and a second annealing process is performed.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

As the size of fin structures in Fin-FET devices becomes smaller, and the density of fin structures in Fin-FET devices becomes higher, solving various problems in Fin-FET devices, such as controlling short channel effect, improving channel current, and reducing energy consumption, becomes important. An effective way to solve the above problems in both P-type Fin-FETs and N-type Fin-FETs may be suppressing bias temperature instability (BTI) effect. Specifically, a variety of carrier traps may be generated by defects formed in the semiconductor structure from the fin structure to the high-k dielectric layer and such carrier traps may be one of the reasons causing the BTI effect.

Figure 1:
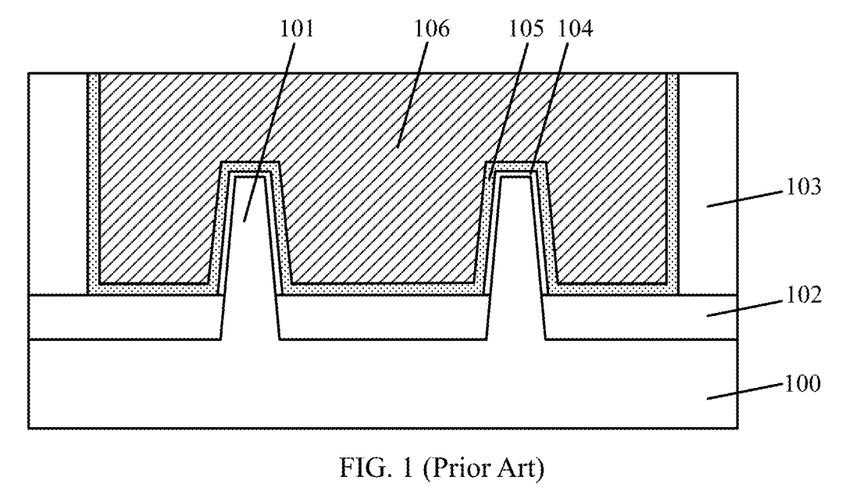
FIG. 1 illustrates a schematic cross-section view of a Fin-FET device formed by an existing method.

FIG. 1 shows a schematic cross-section view of a Fin-FET device formed by an existing fabrication process. The fabrication process for the Fin-FET device shown in FIG. 1 may include the following steps.

First, a substrate 100 is provided. A plurality of fin structures 101 are formed on the surface of the substrate 100. An isolation layer 102 is formed on the surface of the substrate 100. The isolation layer 102 covers a portion of the side surfaces of each fin structure 101. The top surface of the isolation layer 102 is lower than the top surfaces of the fin structures 101.

Then, a dummy gate structure is formed on each fin structure 101. Each dummy gate structure is formed across the entire width of the corresponding fin structure 101 and covers the top surface as well as an upper portion of the side surfaces of the corresponding fin structure 101. The dummy gate structure further includes a dummy gate electrode layer.

Further, a source region and a drain region are formed in each fin structure 101 on the two sides of the dummy gate structure.

After forming the source region and the drain region, a dielectric layer 103 is then formed on the surfaces of the fin structure 101 and the isolation layer 102. The surface of the dielectric layer 103 is leveled with the top surface of the dummy gate electrode layer.

Further, the dummy gate electrode layer is removed and an opening exposing the top surface and a portion of the sidewall surface of each fin structure 101 is formed in the dielectric layer 103.

Then, an interfacial layer 104 is formed on the bottom of the opening. The interfacial layer 104 is formed by an oxidation process.

Further, a high-k dielectric layer 105 is formed on the surface of the interfacial layer 104. The high-k dielectric layer 105 also covers the portion of the isolation 102 formed between the fin structures 101 and the sidewall surfaces of the dielectric layer 103.

Finally, a gate electrode layer 106 is formed on the high-k dielectric layer 105 to fill the opening. The top surface of the gate electrode layer 106 is leveled with the top surface of the dielectric layer 103.

Usually, in the semiconductor structure shown in FIG. 1, the top surface of the fin structure 101 is along the <100>crystal orientation while the sidewall surface of the fin structure 101 is along the <110>crystal orientation. Therefore, the atom density at the sidewall surface of the fin structure 101 is higher than the atom density at the top surface of the fin structure 101. Thus, more dangling bonds are generated at the sidewall surface of the fin structure 101 during the fabrication process. Further, the dangling bonds may likely adsorb impurities and may also easily form charge traps at the interface between the fin structure 101 and the interfacial layer 104. Therefore, the BTI effect may appear in the formed P-type Fin-FET.

Moreover, because the number of dangling bonds at the sidewall and the top surfaces of the fin structure 101 may be large, the interfacial layer 104 formed by the oxidation process may contain a substantial amount of impurities and defects. Therefore, the subsequently-formed high-k dielectric layer 105 may also contain many defects. Defects in the high-k dielectric layer 105 may easily form charge traps, causing the BTI effect in the formed N-type Fin-FET.

Figure 15:
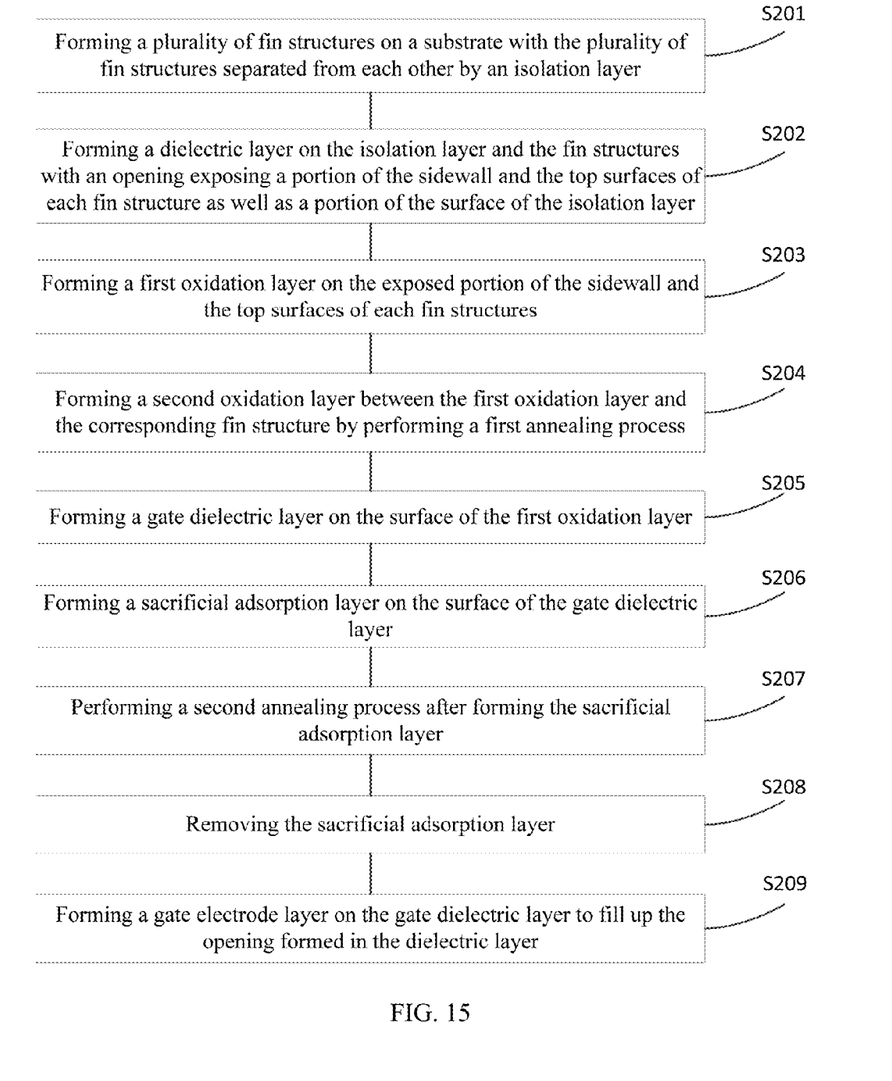
FIG. 15 illustrates a flowchart of an exemplary fabrication process for a Fin-FET device consistent with disclosed embodiments.

In view of the problems described above, the present disclosure provides an improved method to form a Fin-FET device. FIG. 15 shows a flowchart of an exemplary fabrication process for a Fin-FET device consistent with disclosed embodiments. FIGS. 2-11 show schematic views of semiconductor structures corresponding to certain stages of the exemplary fabrication process for the Fin-FET device.

Figure 2:
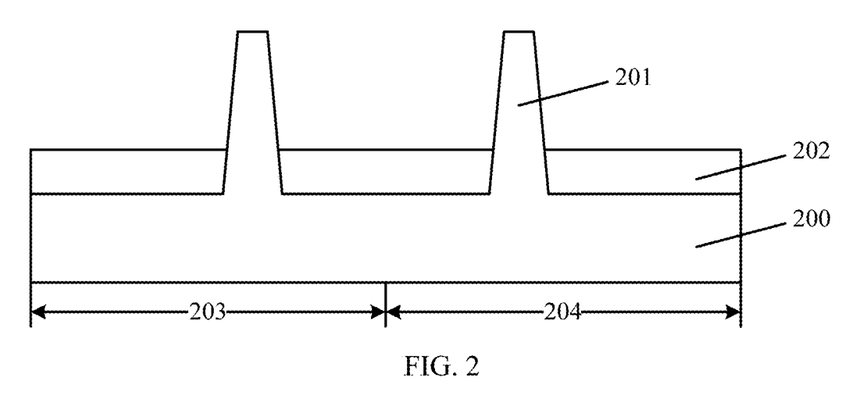
FIGS. 2-11 illustrate schematic views of semiconductor structures corresponding to certain stages of an exemplary fabrication process for a Fin-FET device consistent with disclosed embodiments.

Referring to FIG. 15, at beginning of the fabrication process, a plurality of fin structures may be formed on a substrate (S201). FIG. 2 shows a corresponding semiconductor structure.

Referring to FIG. 2, a substrate 200 is provided. A plurality of fin structures 201 may be formed on the surface of the substrate 200. An isolation layer 202 may be disposed on the surface of the substrate 200. The isolation layer 202 may cover an upper portion of each side surface of the fin structures 201. The top surface of the isolation layer 202 may be lower than the top surface of the fin structures 202. Therefore, an upper portion of each fin structure 201 may be above the top surface of the isolation layer 202.

In one embodiment, the substrate 200 may include a P-type region 203 and an N-type region 204. The fin structures 201 may be formed on the surface of the substrate 200 in both the P-type region 203 and the N-type region 204. The P-type region 203 may be used to form P-type Fin-FETs while the N-type region 204 may be used to form N-type Fin-FETs. For illustration purposes, in one embodiment, the Fin-FET device is described to have only one P-type Fin-FET formed in the P-type region 203 and also only one N-type Fin-FET formed in the N-type region 204. In other embodiments, the number of P-type Fin-FETs formed in the P-type region and/or the number of N-type Fin-FETs formed in the N-type region may not be one.

The semiconductor structure including the substrate 200 and the plurality fin structures 201 may be formed through a process including the following steps. First, a semiconductor substrate may be provided. A mask layer may then be formed on the surface of the semiconductor substrate to cover a portion of the surface of the semiconductor substrate. The covered portion of the surface of the semiconductor substrate may correspond to fin structures 201 to be subsequently formed. A plurality of trenches may be formed in the semiconductor substrate by performing an etching process using the mask layer as an etch mask. Simultaneously with the formation of the trenches, a plurality of fin structures 201 may be formed on the substrate 200. Further, after forming the fin structures 201, the mask layer may be removed. In other embodiments, the mask layer may be removed after forming an isolation layer 202.

The semiconductor substrate may be a bulk substrate or a semiconductor on insulator (SOI) substrate. The bulk substrate may be made of silicon (Si), germanium (Ge), germanium silicon (SiGe), or any other appropriate semiconductor. The SOI substrate may be made of silicon on insulator or germanium on insulator. In one embodiment, the semiconductor substrate is a single crystalline silicon substrate. The surface orientation of the single crystalline silicon substrate may be along the <100> direction. That is, the fin structures 201 and the substrate 200 may be made of single crystalline silicon; the top surfaces of the fin structures may be along the <100> crystal structure, while the sidewall surfaces may be along the <110> direction.

The mask layer may be formed through a multiple mask patterning process. The multiple mask patterning process may include a self-aligned double patterned process, a self-aligned triple patterned process, or a self-aligned double-double patterned (SaDDP) process.

In other embodiment, the fin structures 201 may be formed by a process including the following steps. First, a fin layer may be formed on the surface of the substrate 200 through an epitaxial growth process. A plurality of trenches may be formed by etching the fin layer using an etch mask. Simultaneously with the formation of the trenches, the remaining portion of the fin layer between neighboring trenches may form a plurality of fin structures 201. The substrate 200 may be made of silicon, germanium silicon, silicon carbide (SiC), silicon on insulator, germanium on insulator, glass, or III-V group compound such as GaN, GaAs, etc. The fin structure 201 may be made of Si, Ge, SiC, GeSi, or any appropriate material.

The isolation layer 202 may be used to separate neighboring fin structures 201. The isolation layer 202 may be made of one or more of $SiO_x$, $SiN_x$, SiON, low-k dielectric material (a dielectric material with a dielectric constant greater than or equal to 2.5 but smaller than 3.9), and ultra-low-k dielectric material (a dielectric material with a dielectric constant smaller than 2.5). In one embodiment, the isolation layer 202 is made of $SiO_x$.

The isolation layer 202 may be formed by a process including the following steps. First, an isolation film may be formed on the surfaces of the substrate 200 and the plurality of fin structures 201. Then, a planarization process may be performed on the isolation film until the top surfaces of the plurality of fin structures 201 are exposed. After the planarization process, an etch-back process may be performed on the isolation film to expose an upper portion of the sidewall surfaces of each fin structure 201 and thus form the isolation layer 202.

The isolation film may be formed by chemical vapor deposition (CVD), physical vapor deposition (PVD), plasma enhanced CVD, high aspect ratio process CVD (HARP-CVD), or other appropriate deposition process. The planarization process may be a chemical mechanical polishing (CMP) process. The etch-back process may be an anisotropic dry etching process.

Figure 3:
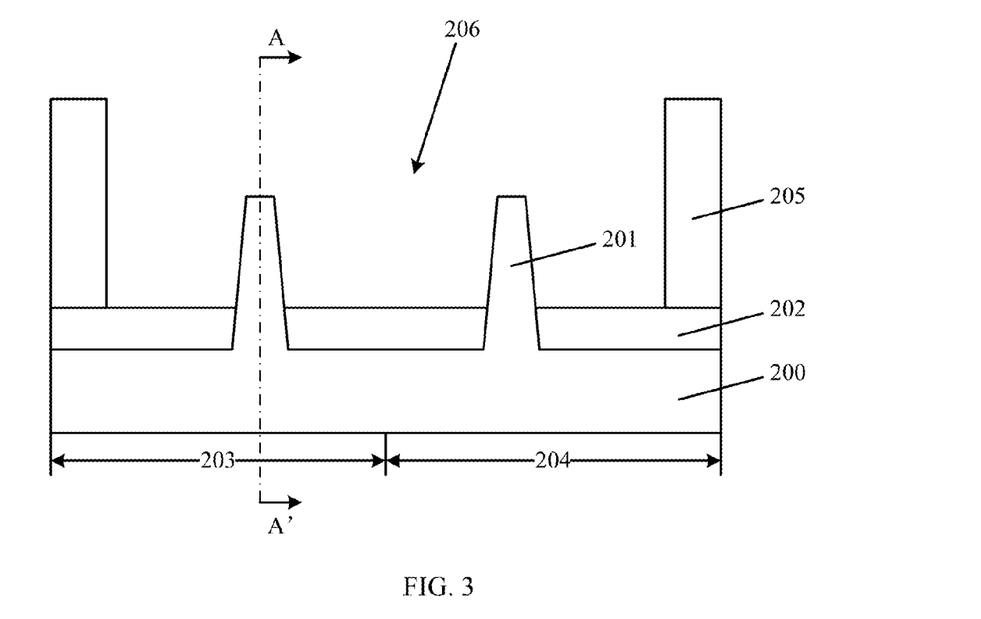
Figure 4:
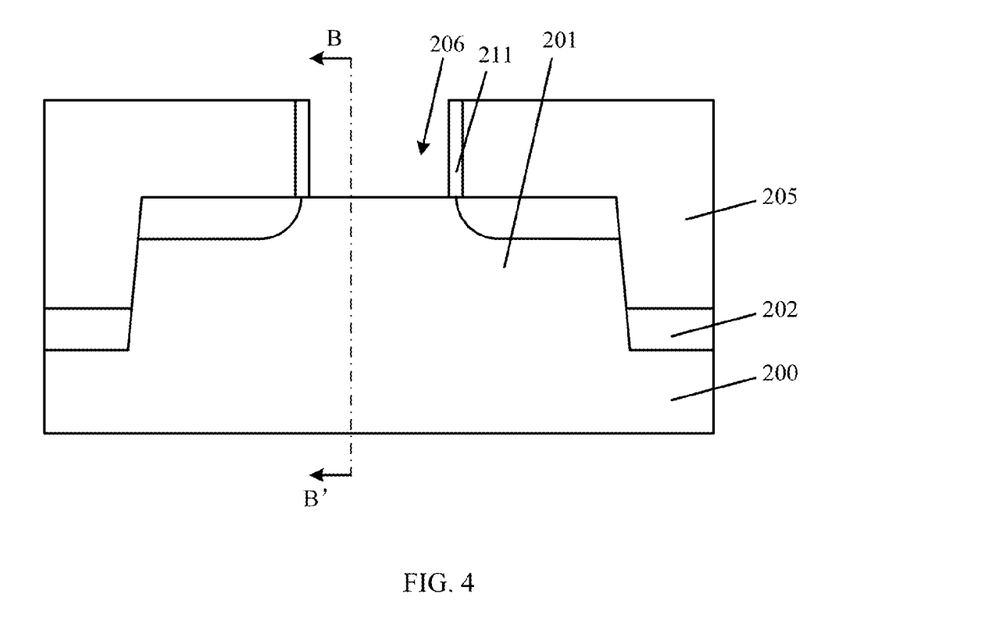

Further, returning to FIG. 15, a dielectric layer may be formed to cover a portion of the isolation layer and a portion of the sidewall and the top surfaces of each fin structure (S202). FIGS. 3 and 4 show schematic views of the corresponding semiconductor structure. FIG. 4 shows a schematic section view of the semiconductor structure shown in FIG. 3 along an AA' line. FIG. 3 shows a schematic view of the semiconductor structure shown in FIG. 4 along a BB' line.

Referring to FIG. 3 and FIG. 4, a dielectric layer 205 may be formed on a portion of the isolation layer 202. The dielectric layer 205 may also cover a portion of the sidewall and the top surfaces of each fin structure 201. An opening 206 may be formed in the dielectric layer 205. Referring to FIG. 3, the opening 206 may be formed across the plurality of fin structures 201. Moreover, referring to FIG. 4, the dimension of the opening 206 may be shorter than the length of each fin structure 201. Thus, the opening 206 may expose a portion of the sidewall and the top surfaces of each fin structure 201 and also a portion of the surface of the isolation layer 202.

In one embodiment, the substrate 200 may include the P-type region 203 and the N-type region 204 and the fin structures 201 may be formed on the surface of the substrate 200 in both the P-type region 203 and the N-type region 204. Correspondingly, the opening 206 may then be formed in both the P-type region 203 and the N-type region 204. The sidewall and the top surfaces of the fin structures 201 formed in the P-type region 203 and in the N-type region 204 may be partially exposed by the opening 206.

The dielectric layer 205 may be formed by a process including the following steps. First, a dummy gate structure may be formed on a portion of the sidewall and the top surfaces of each fin structure 201. The dummy gate structure may be formed across the fin structures 201 and may also cover a portion of the surface of the isolation layer 202. The dummy gate structure may include a dummy gate electrode layer. A source region and a drain region may be formed in each fin structure 201 on the two sides of the dummy gate structure. After forming the source region and the drain region, a dielectric layer 205 may be formed on the surfaces of the isolation layer 202 and the fin structures 201. The surface of the dielectric layer 205 may be leveled with the top surface of the dummy gate electrode layer. Further, the dummy gate electrode layer may be removed to form an opening 206 in the dielectric layer 205.

In one embodiment, the dummy gate electrode layer may also include a dummy gate dielectric layer formed on the sidewall and the top surfaces of the corresponding fin structure 201. The dummy gate electrode layer may be formed on the surface of the dummy gate dielectric layer. The dummy gate structure may further include sidewalls formed on the side surfaces of the dummy gate electrode layer. In addition, after removing the dummy gate electrode layer, the fabrication process may further include removing the dummy gate dielectric layer.

The dummy gate electrode layer may be made of polycrystalline silicon. The dummy gate electrode layer may be made of $SiO_x$. The sidewalls formed on the side surfaces of the dummy gate electrode layer may be made of one or more of $SiO_x$, $SiN_x$, and SiON.

The dummy gate structure may be formed by a process including the following steps. First, a dummy gate dielectric film may be formed on the sidewall and bottom surfaces of the fin structures 201 through a deposition process or an oxidation process. Then, a dummy gate electrode film may be deposited on the surface of the dummy gate dielectric layer. Further, a planarization process may be performed on the dummy gate electrode film. After performing the planarization process, a mask layer may be formed on the surface of the dummy gate electrode film. The mask layer may cover a portion of the surface of the dummy gate electrode film corresponding to the dummy gate electrode layer to be formed. The dummy gate electrode film may then be etched by using the mask layer as an etch mask until the sidewall and the top surfaces of each fin structure 201 as well as the surface of the isolation layer 202 are exposed. As such, the dummy gate electrode layer and the dummy gate dielectric layer may be formed. After forming the dummy gate electrode layer and the dummy gate dielectric layer, a sidewall 211 may be formed on each sidewall surface of the dummy gate electrode layer through a deposition process followed by an etch-back process.

Specifically, a sidewall film may be formed on the top and the sidewall surfaces of the dummy gate electrode layer. The sidewall film may also be formed on the exposed surfaces of the fin structures 201 and the isolation layer 202. Then, an etch-back process may be performed to remove the portion of the sidewall film formed on the top surface of the dummy gate electrode layer as well as the portion of the sidewall film formed on the surfaces of the fin structures 201 and the isolation layer 202. Therefore, after the etch-back process, only the portion of the film formed on the sidewall surface of the dummy gate electrode layer may remain. As such, on each sidewall surface of the dummy gate electrode layer, a sidewall 211 may be formed. The sidewalls 211 may ensure that each source/drain region formed in a subsequent process is isolated from the dummy gate structure. In a subsequent process, the dummy gate structure may be removed; however, the sidewalls 211 may still remain (referring to FIG. 4).

In one embodiment, the source region and the drain region may be formed by an ion implantation process. In another embodiment, the source region and the drain region may also be formed by a process including the following steps. First, a trench may be formed in the fin structures on each side of the dummy gate structure. A stress layer may be formed in the two trenches through a selective epitaxial deposition process. The stress layer in the two trenches may be doped to form a source region and a drain region. The doping process may be ion implantation, in-situ doping, or a combination of ion implantation and in-situ doping. In the P-type region 203, the stress layer may be made of GeSi, the dopant in the stress layer may be P-type ions, and the stress layer may be Σ-type stress layer. In the N-type region, the stress layer may be made of SiC, the dopant in the stress layer may be N-type ions.

The dielectric layer 205 may be formed by a process including the following steps. First, a dielectric film may be formed on the surface of the isolation layer 202, the sidewall and the top surfaces of the fin structures 201, and the surface of the dummy gate structure. Further, the dielectric film may be planarized until the top surface of the dummy gate electrode layer is exposed. After the planarization process, the dielectric layer 205 may then be formed.

The dielectric film may be formed by a CVD, PVD, or atomic layer deposition (ALD) process. The dielectric layer 205 may be made of $SiO_x$, $SiN_x$, SiON, low-k dielectric material (i.e. a material with a dielectric constant greater than or equal to 2.5 but smaller than 3.9, such as porous $SiO_x$, porous $SiN_x$, etc.), or ultra-low-k dielectric material (i.e. a material with a dielectric constant smaller than 2.5, such as porous SiCOH).

In one embodiment, the dielectric layer 205 is made of $SiO_x$. The dielectric film may be formed by a process including one or more of flowable chemical vapor deposition (FCVCD), high density plasma (HDP) deposition, plasma enhanced CVD, etc.

The dummy gate electrode layer may be removed by a dry etching process, a wet etching process, or a process combining both dry etching and wet etching. The dummy gate dielectric layer may be removed by a wet etching process or an isotropic dry etching process.

In one embodiment, the dummy gate electrode layer is made of polycrystalline silicon and the dummy gate electrode layer is removed by an isotropic dry etching process. The process parameters for the isotropic dry etching process may include: a process gas including one or two of fluorocarbon gas, HBr, and $Cl_2$ as well as a carrier gas, wherein the fluorocarbon gas includes $CF_4$, $CHF_3$, $CH_2F_2$, and $CH_3F$ and the carrier gas is an inert gas such as He; a flow rate of the process gas in a range of 50 sccm to 400 sccm; a pressure in a range of 3 mTorr to 8 mTorr; and a bias power in a range of 150 W to 800 W. In another embodiment, the dummy gate electrode layer is removed by a wet etching process. The wet etching process may use a hydrofluoric acid as an etch solution.

In one embodiment, the dummy gate dielectric layer is removed by an isotropic dry etching process such as a SICONI process. The SICONI process may have a uniform etching rate along different directions so that the etching process may remove the dummy gate dielectric layer formed on the sidewall and the top surfaces of the fin structures 201, but have very limited damage to the sidewall and the top surfaces of the fin structures 201.

Figure 5:
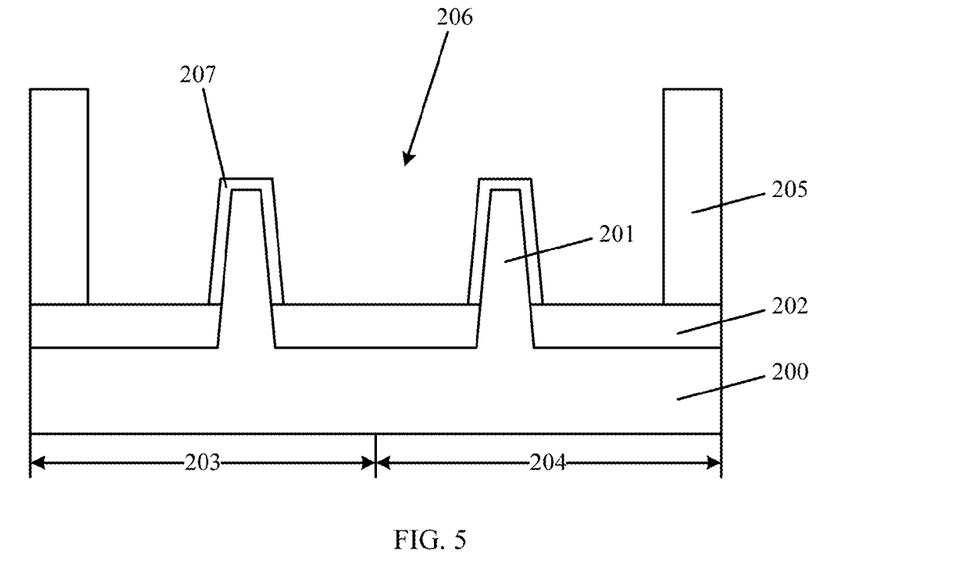

Further, returning to FIG. 15, a first oxidation layer may be formed on the portion of the sidewall and the top surfaces of the fin structures exposed in the opening (S203). FIG. 5 shows a schematic view of the corresponding semiconductor structure.

Referring to FIG. 5, a first oxidation layer 207 may be formed on the portion of the sidewall and the top surfaces of the fin structures 201 exposed in the opening 206. The first oxidation layer 207 may be used as an interfacial layer between subsequently-formed gate dielectric layer and the surface of the corresponding fin structure 201. The first oxidation layer 207 may improve the bonding strength between the gate dielectric layer and the fin structure 201.

The first oxidation layer 207 may be made of $SiO_x$. The first oxidation layer 207 may be formed by a chemical oxidation process, a thermal oxidation process, or an in-situ steam generation (ISSG) process. The first oxidation layer 207 may have a thickness in a range of 5 nm to 10 nm.

In one embodiment, the first oxidation layer 207 is formed through a chemical oxidation process. The chemical oxidation process may include using an ozone-containing solution to oxidize the sidewall and the top surfaces of the exposed portion of the fin structures 201. The first oxidation layer 207 may then be formed on the sidewall and the top surfaces of the exposed portion of the fin structures 201. The ozone-containing solution used in the process may be prepared by introducing ozone gas into water to form a solution with an ozone concentration in a range of 1% to 15%.

Using a chemical oxidation process to form the first oxidation layer 207, the formation rate may be slow and the thickness of the formed first oxidation layer 207 may also be small such that forming overly thick oxidation film in a short period of time may be avoided. Therefore, by using a chemical oxidation process, the first oxidation layer 207 may be thin and the thickness of the first oxidation layer 207 may also be easily controlled.

During the above process to form the fin structures 201 and then remove the dummy gate dielectric layer, dangling bonds may likely be formed on the top and the sidewall surfaces of the fin structures 201. Further, when a chemical oxidation process is used to form the first oxidation layer 207, the dangling bonds may easily cause formation of defects at the interface between the first oxidation layer 207 and the surface of the fin structure 201; in addition, the dangling bonds may easily adsorb impurities while the impurities may further diffuse into the first oxidation layer 207 and the fin structure 201. The defects and impurities between the first oxidation layer 207 and the surface of fin structure 201 may likely cause the BTI effect in the P-type Fin-FET, and thus reduce the performance of the P-type Fin-FET.

In a subsequent process, a second oxidation layer may be formed between the first oxidation layer 207 and the fin structure 201 in order to eliminate undesired effects due to defects and impurities formed between the first oxidation layer 207 and the fin structure 201.

Figure 6:
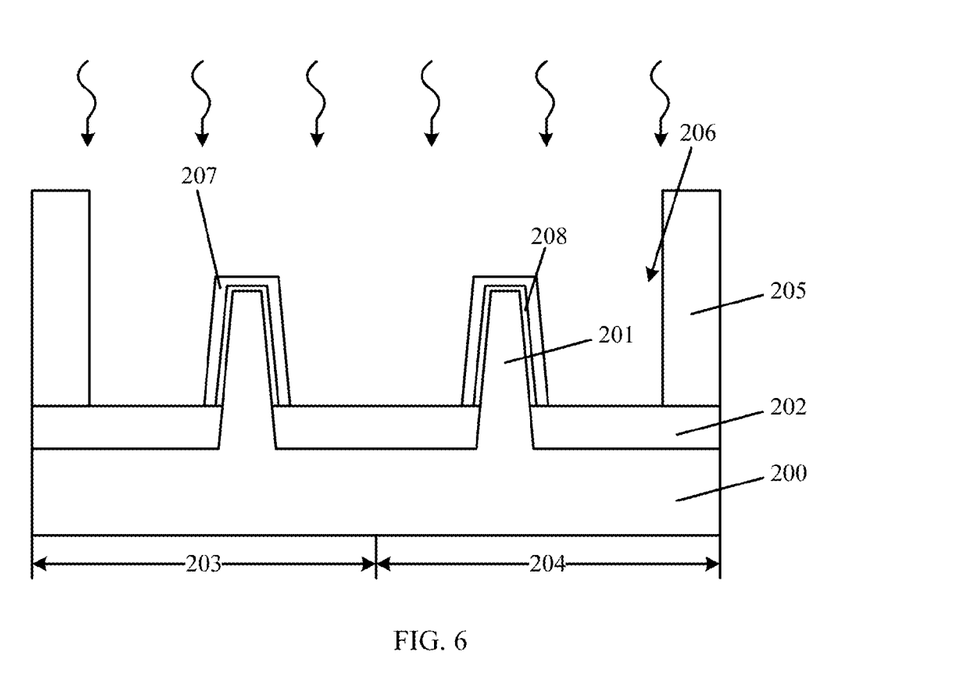

Returning to FIG. 15, a second oxidation layer may be formed between the first oxidation layer and the fin structure through a first annealing process (S204). FIG. 6 shows a schematic view of the corresponding semiconductor structure.

Referring to FIG. 6, a first annealing process may be performed to form a second oxidation layer 208 between the first oxidation layer 207 and the sidewall and the top surfaces of the corresponding fin structure 201.

The first annealing process to form the second oxidation layer 208 may be performed in an oxygen-containing environment. The second oxidation layer 208 may be formed between the first oxidation layer and the fin structure 201. The second oxidation layer 208 may be made of $SiO_x$. Moreover, the atomic percentage concentration of oxygen ions in the second oxidation layer 208 may be higher than the atomic percentage concentration of oxygen ions in the first oxidation layer 207. The second oxidation layer 208 may eliminate the defects formed between the first oxidation layer 207 and the fin structure 201, thus eliminate charge traps at the interface between the first oxidation layer 207 and the fin structure 201.

In one embodiment, the P-type region 203 is used to form a P-type Fin-FET. Reducing charge traps formed at the interface between the first oxidation layer 207 and the fin structure 201 may suppress the BTI effect in the P-type Fin-FET, thus the performance of the P-type FET formed in the P-type region 203 may be improved.

In one embodiment, the first annealing process may be a laser annealing process or a flash annealing process. The annealing time may be in a range from microseconds to milliseconds. The annealing time for the laser annealing process or the flash annealing process may be very short to avoid forming an overly thick second oxidation layer 208.

The first annealing process may include oxygen gas. The volume percentage of the oxygen gas may be lower than 10 ppm. Such a low volume percentage for the oxygen gas may be beneficial to limiting the thickness of the formed second oxygen layer 208, thus may avoid forming an overly thick second oxygen layer 208. A thin second oxygen layer 208 may further help reduce the size of the formed Fin-FET device.

In one embodiment, after performing the first annealing process, the fabrication method may further include a wet etching process to remove a portion of the first oxidation layer 207 in order to avoid having an overly thick first oxidation layer 207. The wet etching process may use hydrofluoric acid as an etch solution. Specifically, the hydrofluoric acid used in the wet etching process may have a volume ratio of hydrofluoric acid to water smaller than or equal to 1:50.

Figure 7:
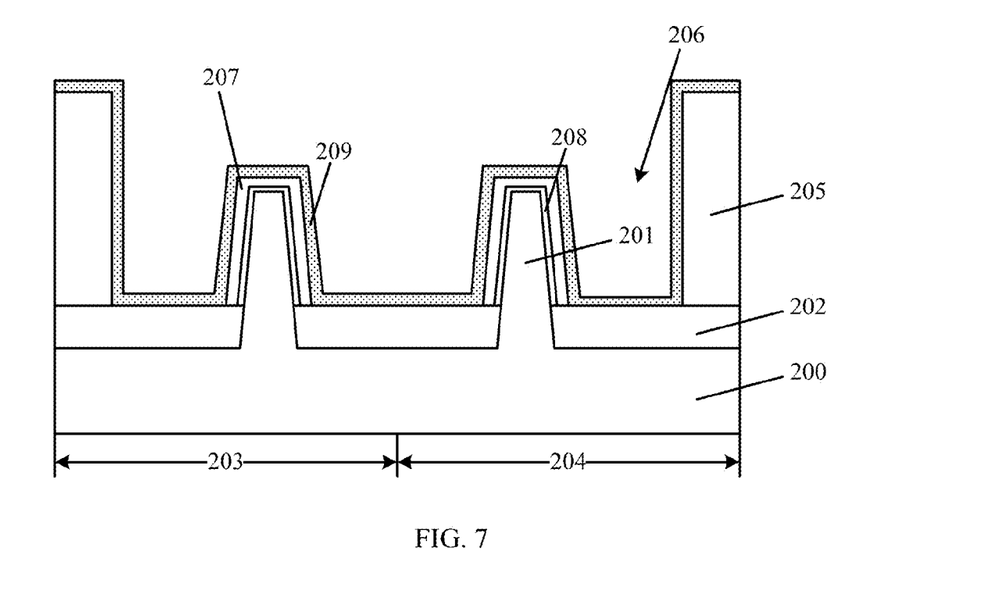

Further, returning to FIG. 15, after the first annealing process, a gate dielectric layer may be formed on the surface of the first oxidation layer (S205). FIG. 7 shows a schematic view of the corresponding semiconductor structure.

Referring to FIG. 7, after the completion of the first annealing process, a gate dielectric layer 209 may be formed on the first oxidation layer 207. The gate dielectric layer 209 may also cover the exposed potion of the isolation layer 202 and the sidewall and the top surfaces of the dielectric layer 205.

The gate dielectric layer 209 may be made of a high-k dielectric material (a material with a dielectric constant higher than 3.9). The high-k dielectric material may include $HfO_2$, $ZrO_2$, $HfSiO_x$, $La_2O_3$, $ZrSiO_x$, $TiO_x$, $Ta_2O_5$, $BaSrTiO_x$, $BaTiO_x$, $SrTiO_x$, $AlO_x$, etc. In one embodiment, the gate dielectric layer 209 is made of $HfO_2$.

The gate dielectric layer 209 may be formed by a CVD, PVD, or ALD process. In one embodiment, the gate dielectric layer 209 made by a deposition process may also cover the surface of the dielectric layer 205, the sidewall surface of the opening 206, and the surface of the first oxidation layer 207. The gate dielectric layer is formed by an ALD process. The ALD process may demonstrate desired step coverage ability so that the formed gate dielectric layer may have a uniform thickness and may also be tightly bonded to the sidewall of the opening 206 and the surface of the first oxidation layer 207.

Because defects and impurities may have been formed in the first oxidation layer 207 and also at the surface of the first oxidation layer 207, defects and impurities may likely be formed at the interface between the formed gate dielectric layer 209 and the first oxidation layer 207. In addition, defects, especially oxygen vacancies, may also be formed in the gate dielectric layer 209. The defects present at the interface between the gate dielectric layer 209 and the first oxidation layer 207 as well as oxygen vacancies formed in the gate dielectric layer 209 may further form charge traps, which may likely cause the BTI effect in the N-type Fin-FET formed in the N-type region 204.

A sacrificial adsorption layer may then be formed to adsorb the defects and impurities in order to avoid undesired effect due to defects formed in the gate dielectric layer 209 and also at the interface between the gate dielectric layer 209 and the first oxidation layer 207.

Figure 8:
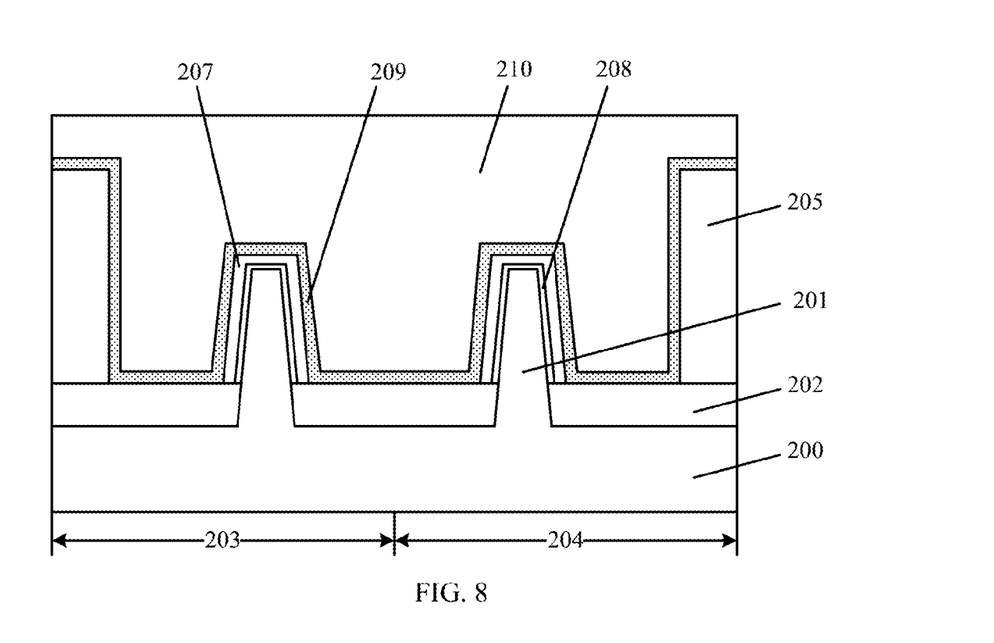

Returning to FIG. 15, a sacrificial adsorption layer may be formed on the surface of the gate dielectric layer (S206). FIG. 8 shows a schematic view of the corresponding semiconductor structure.

Referring to FIG. 8, a sacrificial adsorption layer 210 may be formed on the surface of the gate dielectric layer 209. The sacrificial adsorption layer 210 may be used to adsorb the defects formed in the gate dielectric layer 209 and also at the interface between the gate dielectric layer 209 and the first oxidation layer 207. Therefore, introducing the sacrificial adsorption layer 210 may eliminate charge traps, thus suppressing the BTI effect in the N-type Fin-FET.

In one embodiment, the sacrificial adsorption layer 201 is made of polycrystalline silicon. The sacrificial adsorption layer 210 may fill up the opening 206 (referring to FIG. 7). Prior to subsequent formation of a gate electrode layer, the sacrificial adsorption layer 210 may be removed to re-expose the opening 206.

The sacrificial adsorption layer 210 may be formed by a CVD process. The process parameters used in the CVD process may include: a process gas including silicon-containing gas ($SiH_4$ or $SiH_2Cl_2$) and hydrogen-containing gas (such as HCl and $H_2$); a flow rate of the silicon-containing gas in a range of 1 ml/min to 1000 ml/min; a flow rate of HCl in a range of 1 ml/min to 1000 ml/min; a flow rate of H2 in a range of 0.1 l/min to 50 l/min; a process temperature in a range of 500° C. to 800° C.; a process pressure in a range of 1 Torr to 100 Torr.

In other embodiments, the sacrificial adsorption layer may not completely fill up the opening. The thickness of the sacrificial adsorption layer may be very thin (for example, the thickness may be smaller than or equal to 30 nm). The sacrificial adsorption layer may cover the surface of the gate dielectric layer uniformly. Further, prior to subsequent formation of a gate electrode layer, the sacrificial adsorption layer may not be removed.

Figure 9:
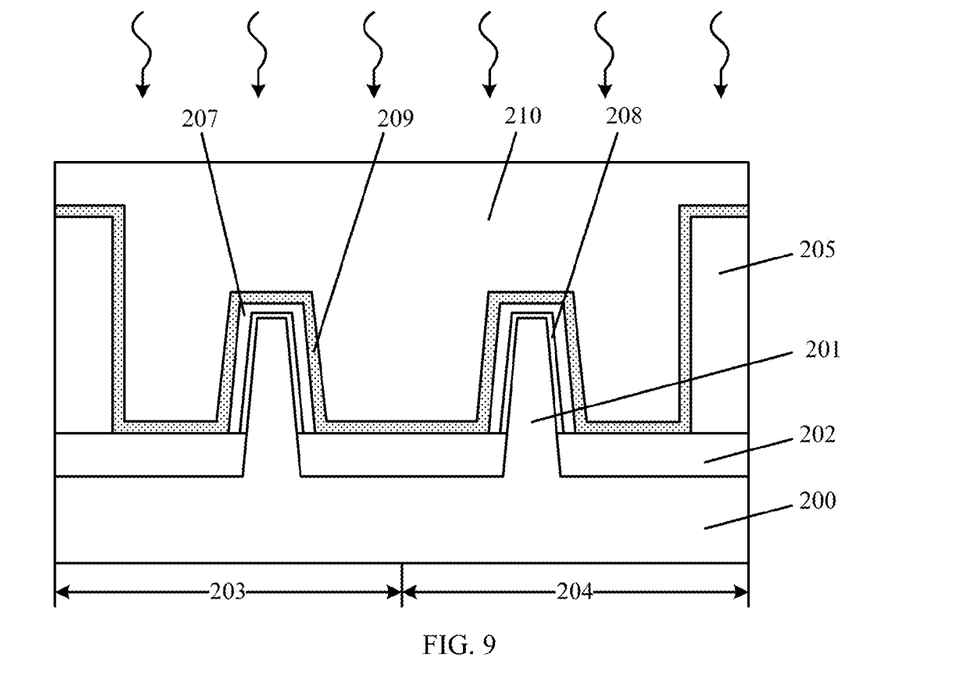

Returning to FIG. 15, after forming the sacrificial adsorption layer, a second annealing process may be performed (S207). FIG. 9 shows a schematic view of the corresponding semiconductor structure.

Referring to FIG. 9, a second annealing process may be performed. The second annealing process may be used to let the sacrificial adsorption layer 210 adsorb defects and impurities formed at the surfaces of the fin structure 201 and the first oxidation layer 207, and also adsorb defects and impurities formed inside the first oxidation layer 207 and the gate dielectric layer 209. The second annealing process may eliminate the defects formed at the interface between the first oxidation layer 207 and the gate dielectric layer 209 and also the defects formed inside the gate dielectric layer 209.

In one embodiment, the sacrificial adsorption layer 210 is made of polycrystalline silicon. Polycrystalline silicon may demonstrate desired ability to adsorb oxygen vacancies, and thus may adsorb oxygen vacancies formed in the gate dielectric layer 209 and also at the interface between the first oxidation layer 207 and the gate dielectric layer 209. Therefore, the BTI effect in the N-type Fin-FET formed in the N-type region 204 may be suppressed.

In one embodiment, the second annealing process is a furnace annealing process. The annealing temperature may be in a range of 500° C. to 600° C. The annealing process may be performed in an inert gas environment. In one embodiment, the second annealing process is performed at a temperature of 550° C. Because of the low annealing temperature, the surface of the fin structures 201 may not be further oxidized, and the thickness of the second oxidation layer 208 may be under control. In addition, the moderate annealing temperature may not cause oxidation of the sacrificial adsorption layer 210, and may not affect the subsequent process to remove the sacrificial adsorption layer 210. As such, residue on the surface of the gate dielectric layer may be avoided after the subsequent removal of the sacrificial adsorption layer 210.

During the second annealing process, oxygen vacancies formed at the interface between the first oxidation layer 207 and the gate dielectric layer 209 as well as oxygen vacancies formed inside the gate dielectric layer 209 may be adsorbed to the surface of the polycrystalline-silicon-made sacrificial adsorption layer 210. Therefore, the defects initially formed in the gate dielectric layer 209 and at the interface between the gate dielectric layer 209 and the first oxidation layer 207 may be eliminated.

In the meantime, because the atomic percentage concentration of oxygen ions in the second oxidation layer 208 is very high, oxygen ions may be thermally driven and released to the sacrificial adsorption layer 210 during the second annealing process. Moreover, the oxygen ions may fill the oxygen vacancies in the first oxidation layer 207 and the gate dielectric layer 209. Therefore, the second annealing process not only may eliminate defects but also may reduce the electrical thickness for both the first oxidation layer 207 and the second oxidation layer 208, suppressing the BTI effect in N-type Fin-FET.

Figure 10:
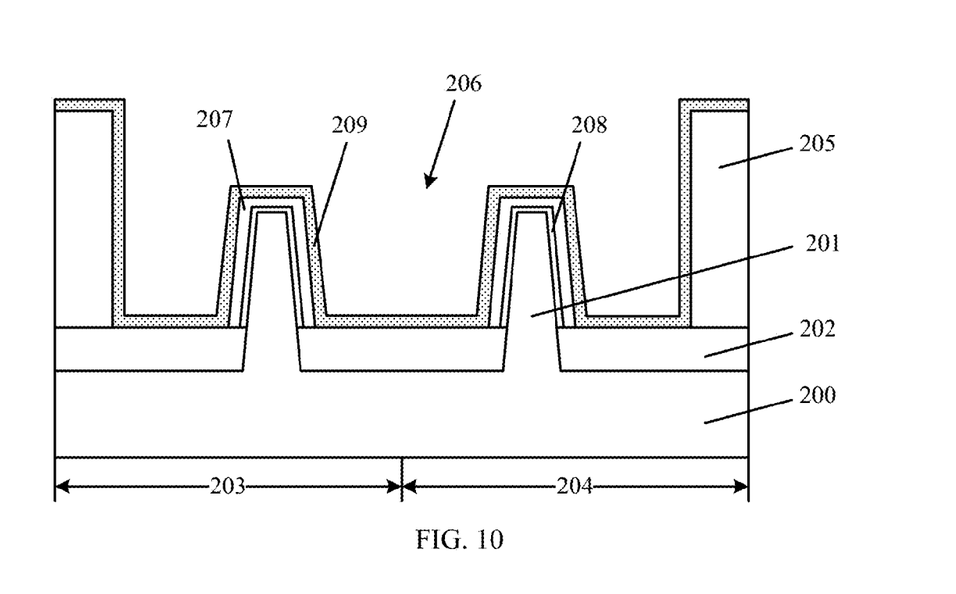

Further, returning to FIG. 15, the sacrificial adsorption layer may then be removed (S208). FIG. 10 shows a schematic view of the corresponding semiconductor structure.

Referring to FIG. 10, the sacrificial adsorption layer 210 (referring to FIG. 9) may be removed. In one embodiment, the sacrificial adsorption layer 210 is formed to fill up the opening 206. Therefore, prior to subsequent formation of a gate electrode layer, the sacrificial adsorption layer 210 may need to be removed.

The sacrificial adsorption layer 210 may be removed by a dry etching process or a wet etching process. In one embodiment, the sacrificial adsorption layer 210 is removed by a wet etching process. The wet etching process may have no damage or very limited damage to the surface of the gate dielectric layer 209. When the sacrificial adsorption layer 210 is made of polycrystalline silicon, the wet etching process to remove the sacrificial adsorption layer 210 may use a tetramethylammonium hydroxide solution as an etch solution.

Because oxygen ions released from the second oxidation layer 208, the first oxidation layer 207, and gate dielectric layer 209 may be adsorbed to the surface of the sacrificial adsorption layer 210, the oxidation layer formed by the oxygen ions may also be removed with the removal of the sacrificial adsorption layer 210.

Figure 11:
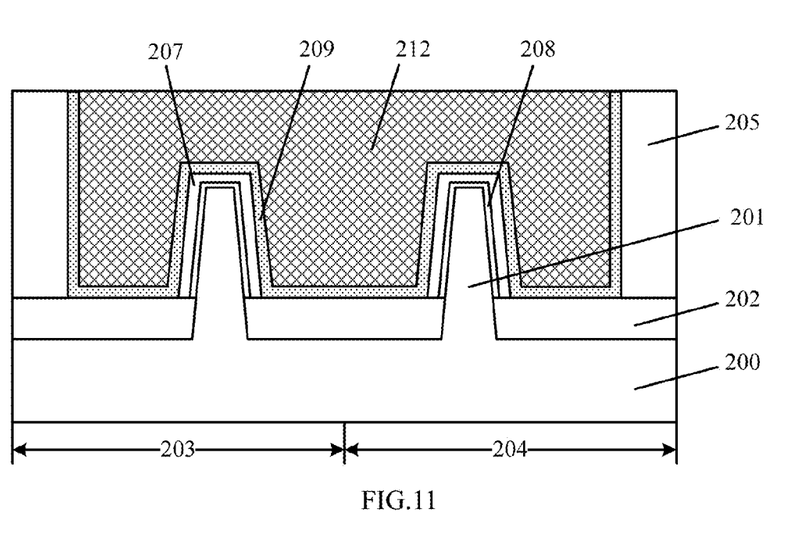

Further, returning to FIG. 11, after the removal of the sacrificial adsorption layer, a gate electrode layer filling up the opening may be formed on the gate dielectric layer (S209). FIG. 11 shows a schematic view of the corresponding semiconductor structure.

Referring to FIG. 11, after removing the sacrificial adsorption layer 210. A gate electrode layer 212 may be formed on the gate dielectric layer 209. The gate electrode layer 212 may fill up the opening 206.

In one embodiment, prior to the formation of the gate electrode layer 212, the fabrication method also includes forming a covering layer (not shown) on the surface of the gate dielectric layer 209.

The covering layer may be made of one or two of TiN and TaN. The covering layer may have a thickness in a range of 3 nm to 8 nm. In one embodiment, the thickness of the covering layer is 5 nm. The covering layer may be formed by a CVD, PVD, or ALD process. In one embodiment, the covering layer is formed by an ALD process. The covering layer may be used to prevent the material of a subsequently-formed gate electrode layer 212 or work function layer from diffusing to the gate dielectric layer 209.

In another embodiment, after forming the covering layer on the surface of the gate dielectric layer, a sacrificial adsorption layer may further be formed on the surface of the covering layer. Further, after the formation of the sacrificial adsorption layer, a second annealing process may be performed. Finally, after performing the second annealing process, a gate electrode layer may then be formed on the surface of the covering layer and the sacrificial adsorption layer.

In one embodiment, after performing the second annealing process, the sacrificial adsorption layer may be removed before forming the gate electrode layer. In another embodiment, the sacrificial adsorption layer may not completely fill up the opening while the sacrificial adsorption layer may cover the gate dielectric layer uniformly. Therefore, after the completion of the second annealing process, the covering layer and the gate electrode layer may be directly formed on the surface of the sacrificial adsorption layer.

The gate electrode layer 212 may be formed by a process including the following steps. First, a gate electrode film filling the opening 206 may be formed on the surface of the dielectric layer 205 and also in the opening 206. Then, a planarization process may be performed to remove a portion of the gate electrode film until the surface of the dielectric layer 205 is exposed. As such, a gate electrode layer 212 filling up the opening 206 may be formed.

The gate electrode layer 212 may be made of Cu, W, Al, or Ag. The gate electrode layer 212 may be formed by a CVD, PVD, ALD, electroplating, or chemical plating process. The planarization process may be a CMP process.

In one embodiment, prior to the formation of the gate electrode film, the fabrication method may also include forming a work function film on the surface of the dielectric layer 205 and also on the sidewall and bottom surfaces of the opening 206. Correspondingly, the gate electrode film may be formed on the surface of the work function film. After removing the portion of the gate electrode film formed above the dielectric layer 205 through a planarization process, the planarization process may be continued to further remove the portion of the work function layer formed on the surface of the dielectric layer 205 and thus form a work function layer.

Because the P-type region 203 is used to form a P-type Fin-FET while the N-type region 204 is used to form an N-type Fin-FET, the formation process for the work function layer may further include: forming a P-type work function film on the surface of the covering layer; removing the portion of the P-type work function film formed in the N-type region 204; after removing the portion of the P-type work function film formed in the N-type region 204, forming an N-type work function film on the surfaces of the covering layer and the P-type work function film; forming a gate electrode film on the N-type work function film to fill up the opening 206; planarizing the gate electrode film, the P-type work function film, the N-type work function film, the covering layer, and the gate dielectric layer 209 until the surface of the dielectric layer 205 is exposed. Further, the P-type work function material may include TiN while the N-type work function material may include TiAl.

According to the disclosed fabrication method, the second oxidation layer formed by the first annealing process may be situated between the first oxidation layer and the sidewall and the top surfaces of the fin structure, thus defects formed between the first oxidation layer and the sidewall and the top surfaces of the fin structures may be eliminated. Therefore, charge traps formed between the first oxidation layer and the sidewall and the top surfaces of the fin structure may also be eliminated so that the BTI effects in P-type Fin-FET may be suppressed.

Further, because the sacrificial adsorption layer is made of polycrystalline silicon, the sacrificial adsorption layer may demonstrate desired ability in adsorbing oxygen vacancies and dangling bonds. Therefore, during the second annealing process, the sacrificial adsorption layer may adsorb defects formed in the gate dielectric layer and also at the interface between the first oxidation layer and the gate dielectric layer, thus defects at the interface between the first oxidation layer and the gate dielectric layer as well as charge traps in the gate dielectric layer may be eliminated. As such, the BTI effect in N-type Fin-FET may also be suppressed.

According to the disclosed method, BTI effects may be suppressed for both P-type Fin-FET and N-type Fin-FET. Therefore, for Fin-FET device formed by the disclosed method, leakage current may be reduced, short channel effect may be suppressed, channel current may be improved, and energy consumption may be reduced. Thus, the performance of the Fin-FET device may be improved.

Figure 12:
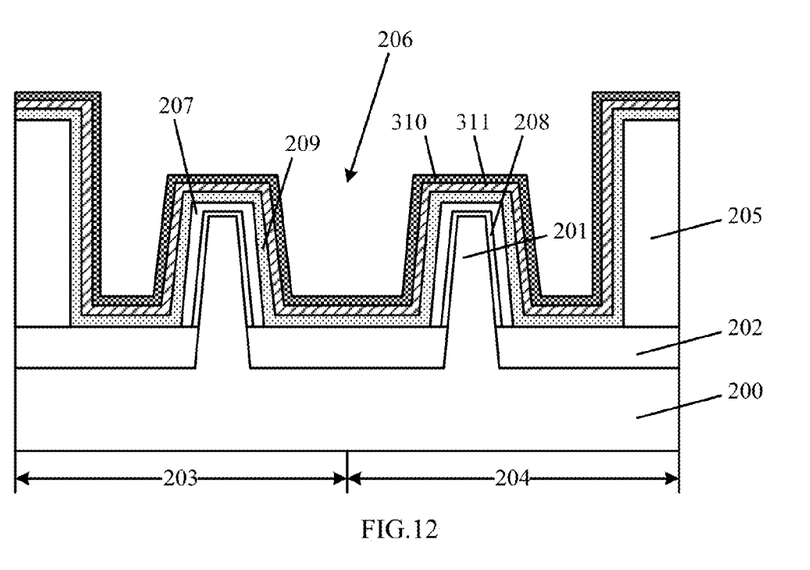
FIGS. 12-14 illustrate schematic views of semiconductor structures corresponding to certain stages of another exemplary fabrication process for a Fin-FET device consistent with disclosed embodiments.
Figure 13:
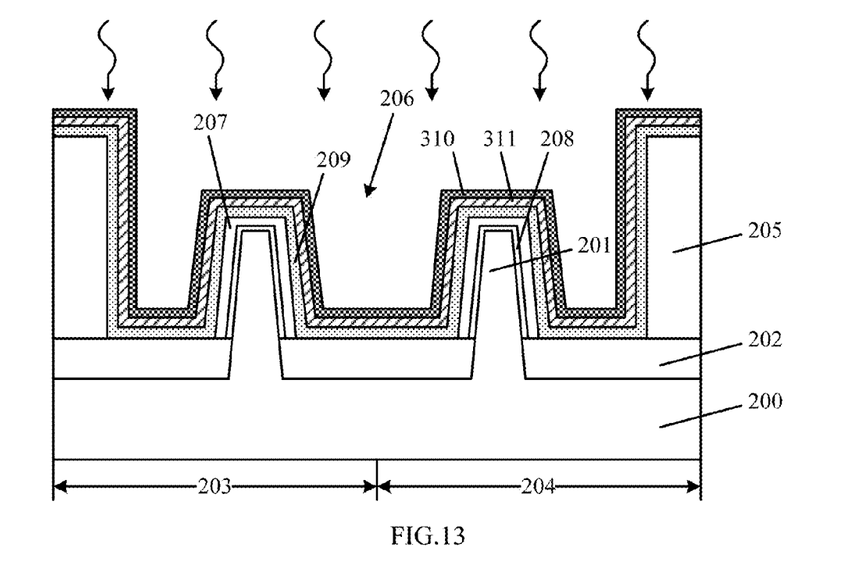
Figure 14:
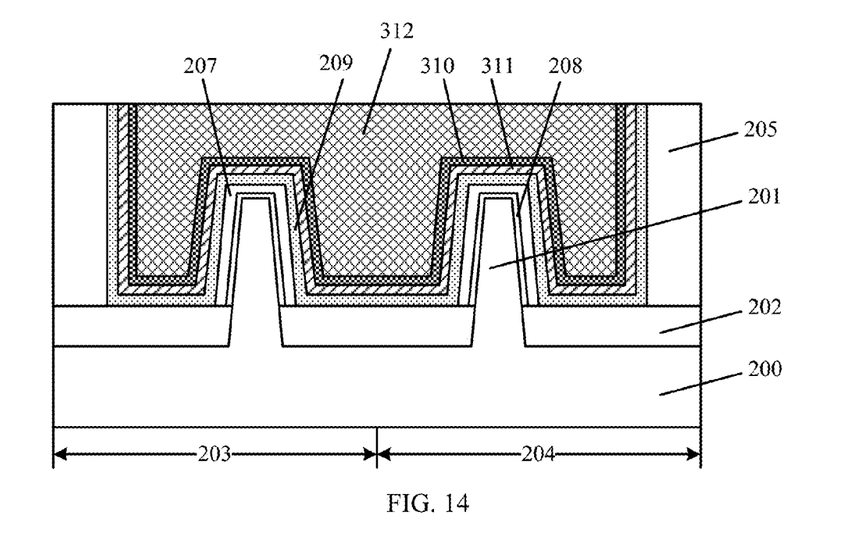

FIGS. 12-14 show schematic views of the semiconductor structures corresponding to certain stages of another exemplary fabrication process consistent with disclosed embodiments. Further, semiconductor structures shown in FIGS. 12-14 are formed from the structure shown in FIG. 7. That is, semiconductor structures shown in FIGS. 2-7 also correspond to certain stages of the fabrication process.

Referring to FIG. 7 and FIG. 12, after forming the gate dielectric layer 209, a sacrificial adsorption layer 310 may be formed on the surface of the gate dielectric layer 209.

In one embodiment, the sacrificial adsorption layer 310 may be made of TiAlC. In addition, prior to the formation of the sacrificial adsorption layer 310, a covering layer 311 may be formed on the surface of the gate dielectric layer 209. Correspondingly, the sacrificial adsorption layer 310 may then be formed on the surface of the covering layer 311. The covering layer 311 may be made of TiN.

The thickness of the covering layer 311 may be in a range of 3 nm to 8 nm. In one embodiment, the thickness of the covering layer 311 is 5 nm. The covering layer 311 may be formed by a CVD, PVD, or ALD process. In one embodiment, the covering layer 311 is formed by an ALD process. The covering layer 311 may be used to prevent the material of a subsequently-formed gate electrode layer or a subsequently-formed work function layer from diffusing to the gate dielectric layer 209.

Further, the sacrificial adsorption layer 310 may be made of TiAlC. Specifically, Al ions in the sacrificial adsorption layer may improve the ability to adsorb defects formed in the gate dielectric layer 209 and also at the interface between the gate dielectric layer 209 and the first oxidation layer 207, thus charge traps may be eliminated and the BTI effects in the formed N-type Fin-FET may be suppressed.

Moreover, C ions in the sacrificial adsorption layer 310 may help suppress the diffusion of the Al ions in the sacrificial adsorption layer 310. Specifically, C ions in the sacrificial adsorption layer 310 may prevent Al ions from diffusing into the gate dielectric layer 209, the first oxidation layer 207, and the second oxidation layer 208. Therefore, stable dielectric coefficients may be ensured for the first oxidation layer 207, the second oxidation layer 208, and the gate dielectric layer 209, and thus stable and controllable threshold voltages of the formed Fin-FET may also be ensured.

The sacrificial adsorption layer 310 may be formed by a CVD, PVD, or ALD process. In one embodiment, the sacrificial adsorption layer 310 is made of an ALD process. The thickness of the sacrificial adsorption layer 310 may be smaller than or equal to 1 nm. When the thickness of the sacrificial adsorption layer 310 is small, keeping the sacrificial adsorption layer in the ultimately-formed Fin-FET device may not significantly affect the performance of the Fin-FET device.

Further, referring to FIG. 13, after forming the sacrificial adsorption layer 310, a second annealing process may be performed.

The second annealing process may be used to let the sacrificial adsorption layer 310 adsorb defects and impurities formed at the surfaces of the fin structure 201 and the first oxidation layer 207 and also formed inside the first oxidation layer 207 and the gate dielectric layer 209. The second annealing process may eliminate the defects formed at the interface between the first oxidation layer 207 and the gate dielectric layer 209 and also formed inside the gate dielectric layer 209.

In one embodiment, the sacrificial adsorption layer 310 is made of TiAlC. Al ions in the sacrificial adsorption layer 310 may adsorb oxygen vacancies. Specifically, Al ions in the sacrificial adsorption layer 310 may adsorb oxygen vacancies in the gate dielectric layer 209 and also at the interface between the gate dielectric layer 209 and the first oxidation layer 207. Therefore, BTI effects in N-type Fin-FET formed in the N-type region 204 may be suppressed.

In one embodiment, the second annealing process may be a furnace annealing process. The annealing temperature may be in a range of 500° C. to 600° C. The annealing process may be performed in an inert gas environment. In one embodiment, the second annealing process is performed at a temperature of 550° C. Because of the low annealing temperature, the surface of the fin structures 201 may not be further oxidized, thus the thickness of the second oxidation layer 208 may be under control. In addition, the moderate annealing temperature may not cause oxidation of the sacrificial adsorption layer 310, thus may not affect the subsequent process to remove the sacrificial adsorption layer 310. As such, residue on the surface of the gate dielectric layer may be avoided after the subsequent removal of the sacrificial adsorption layer 310. Further, because of the low annealing temperature, TiN used to form the covering layer 311 may not be crystallized. As TiN in the covering layer 311 remains amorphous, the threshold voltage may not be shifted.

During the second annealing process, oxygen vacancies formed at the interface between the first oxidation layer 207 and the gate dielectric layer 209 and oxygen vacancies formed inside the gate dielectric layer 209 may be adsorbed to the surface of the polycrystalline-silicon-made sacrificial adsorption layer 310. Therefore, the defects initially formed in the gate dielectric layer 209 and at the interface between the gate dielectric layer 209 and the first oxidation layer 207 may be eliminated.

In the meantime, because the atomic percentage concentration of oxygen ions in the second oxidation layer 208 is very high, oxygen ions may be thermally driven and released to the sacrificial adsorption layer 310 during the second annealing process. Moreover, the oxygen ions may fill the oxygen vacancies in the first oxidation layer and the gate dielectric layer 209. Therefore, the second annealing process may not only eliminate defects but also reduce the electrical thickness for both the first oxidation layer 207 and the second oxidation layer 208, thus may suppress the BTI effect in N-type Fin-FET.

Further, referring to FIG. 14, after the completion of the second annealing process, a gate electrode layer 312 may be formed in the opening 206 and also on the surface of the sacrificial adsorption layer 310. The gate electrode layer 312 may fill up the opening 206.

In one embodiment, prior to the formation of the gate electrode layer 312, the sacrificial adsorption layer 310 may not be removed. In another embodiment, after the completion of the second annealing process, the sacrificial adsorption layer may be removed. Further, after the removal of the sacrificial adsorption layer, a gate electrode layer may be formed on the surface of the covering layer.

The gate electrode layer 312 may be formed by a process including the following steps. First, a gate electrode film filling the opening 206 may be formed on the surface of the dielectric layer 205 and also in the opening 206. Then, a planarization process may be performed to remove a portion of the gate electrode film until the surface of the dielectric layer 205 is exposed. As such, a gate electrode layer 312 filling up the opening 206 may be formed.

The gate electrode layer 312 may be made of Cu, W, Al, or Ag. The gate electrode layer 312 may be formed by a CVD, PVD, ALD, electroplating, or chemical plating process. The planarization process may be a chemical mechanical polishing (CMP) process.

In one embodiment, prior to the formation of the gate electrode film, the fabrication method may also include forming a work function film on the surface of the dielectric layer 205 and also on the sidewall and bottom surfaces of the opening 206. Then, the gate electrode film may be formed on the surface of the work function film. After removing the portion of the gate electrode film formed above the dielectric layer 205 through a planarization process, the planarization process may be required to further remove the portion of the work function layer formed on the surface of the dielectric layer 205 to form a work function layer.

Because the P-type region 203 is used to form a P-type Fin-FET while the N-type region 204 is used to form an N-type Fin-FET, the formation process for the work function layer may further include: forming a P-type work function film on the surface of the covering layer 311; removing the portion of the P-type work function film formed in the N-type region 204; after removing the portion of the P-type work function film formed in the N-type region 204, forming an N-type work function film on the surfaces of the covering layer 311 and the P-type work function film; forming a gate electrode film on the N-type work function film to fill up the opening 206; planarizing the gate electrode film, the P-type work function film, the N-type work function film, the covering layer 311, and the gate dielectric layer 209 until the surface of the dielectric layer 205 is exposed. Moreover, material for the P-type work function may include TiN while material for the N-type work function may include TiAl.

According to the disclosed fabrication method, the sacrificial adsorption layer may be made of TiAlC. Further, the absorption layer may demonstrate desired ability in adsorbing oxygen vacancies and dangling bonds. Therefore, during the second annealing process, the sacrificial adsorption layer may adsorb defects formed in the gate dielectric layer and also at the interface between the first oxidation layer and the gate dielectric layer, thus defects at the interface between the first oxidation layer and the gate dielectric layer as well as charge traps in the gate dielectric layer may be eliminated. As such, the BTI effect in N-type Fin-FET may also be suppressed. Therefore, according to the disclosed method and structure, the BTI effects may be suppressed for both P-type Fin-FET and N-type Fin-FET.

The present disclosure also provides a Fin-FET device. FIG. 11 shows a schematic view of an exemplary Fin-FET device consistent with disclosed embodiments.

Referring to FIG. 11, the Fin-FET device includes a substrate 200 and a plurality of fin structures 201 formed on the substrate 200. The Fin-FET device may include an isolation layer 202 formed on the surface of the substrate 200. The isolation layer 202 may cover a portion of each side surface of the fin structures 201. The top surface of the isolation layer 202 may be below the top surface of the fin structures 202. Therefore, a top portion of each fin structure 201 may be above the top surface of the isolation layer 202. The substrate 200 may include a P-type region 203 and an N-type region 204. The fin structures 201 may be formed on the surface of the substrate 200 in both the P-type region 203 and the N-type region 204 with P-type Fin-FETs formed in the P-type region 203 while N-type Fin-FETs formed in the N-type region 204.

The Fin-FET device further includes a dielectric layer 205 formed on the isolation layer 202. An opening may be formed in the dielectric layer 205 so that a portion of each fin structure 201 may be exposed in the opening. That is, the opening only exposes a portion of the sidewall and the top surfaces of each fin structure 201.

The Fin-FET device also includes a first oxidation layer 207 and a second oxidation layer 208. The first oxidation layer 207 and the second oxidation layer 208 may cover the sidewall and the top surfaces of a portion of each fin structure 201. Specifically, the second oxidation layer 208 may be formed between the first oxidation layer 207 and the top and sidewall surfaces of each fin structure 201. Further, the second oxidation layer 208 may be formed by a first annealing process such as laser annealing and flash annealing after the first oxidation layer 207 is formed.

The Fin-FET device further includes a gate dielectric layer 209 and a gate electrode layer 212. The gate dielectric layer 209 may cover the surface of the first oxidation layer 207 and the isolation layer 202 as well as the sidewall surface of the dielectric layer 205. The gate electrode layer 212 may be formed to cover the surface of the gate dielectric layer 209 and also fill up the opening formed in the dielectric layer 205. The top surface of the gate electrode layer 212 may be leveled with the top surface of the dielectric layer 205. Moreover, prior to the formation of the gate electrode layer 212, a sacrificial adsorption layer may be formed on the gate dielectric layer 209 and a second annealing process may then be performed. The sacrificial adsorption layer may or may not be removed after the second annealing process.

According to the disclosed Fin-FET device, the second oxidation layer formed by the first annealing process may be situated between the first oxidation layer and the sidewall and the top surfaces of the fin structure, and defects formed between the first oxidation layer and the sidewall and the top surfaces of the fin structure may be eliminated. Therefore, charge traps formed between the first oxidation layer and the sidewall and the top surfaces of the fin structure may also be eliminated so that the BTI effects in P-type Fin-FETs may be suppressed.

Further, because the sacrificial adsorption layer is made of polycrystalline silicon, the sacrificial adsorption layer may demonstrate desired ability in adsorbing oxygen vacancies and dangling bonds. Therefore, during the second annealing process, the sacrificial adsorption layer may adsorb defects formed in the gate dielectric layer and also at the interface between the first oxidation layer and the gate dielectric layer, thus defects at the interface between the first oxidation layer and the gate dielectric layer as well as charge traps in the gate dielectric layer may be eliminated. Thus, the BTI effect in N-type Fin-FETs may also be suppressed.

According to the disclosed Fin-FET device, BTI effects may be suppressed for both P-type Fin-FETs and N-type Fin-FETs formed on the Fin-FET device, thus leakage current in the Fin-FETs may be reduced, short channel effect may be suppressed, channel current may be improved, while energy consumption may be reduced. Therefore, the performance of the Fin-FET device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a Fin-FET device, comprising:
    forming a plurality of discrete fin structures and an isolation layer on a substrate, wherein the plurality of fin structures are separated from each other by the isolation layer, the isolation layer covers a bottom portion of sidewall surfaces of each fin structure, and a top surface of the isolation layer is below a top surface of the plurality of fin structures;
    forming a dielectric layer on a portion of the isolation layer and also on a portion of sidewall and top surfaces of the plurality of fin structures, wherein another portion of sidewall and top surfaces of the plurality of fin structures is exposed by an opening formed across the plurality of fin structures in the dielectric layer;
    forming a first oxidation layer on the exposed portion of sidewall and top surfaces of each fin structure through an oxidation process;
    forming a second oxidation layer between the first oxidation layer and the sidewall and the top surfaces of each fin structure through a first annealing process;
    forming a gate dielectric layer on the first oxidation layer;
    forming a sacrificial adsorption layer on the gate dielectric layer;
    performing a second annealing process after forming the sacrificial adsorption layer; and
    forming a gate electrode layer to fill the opening formed in the dielectric layer.

2. The method for fabricating the Fin-FET device according to claim 1, wherein the sacrificial adsorption layer is made of polycrystalline silicon.

3. The method for fabricating the Fin-FET device according to claim 2, wherein:
    after performing the second annealing process, the sacrificial adsorption layer is removed; and
    the gate electrode layer is formed on the gate dielectric layer.

4. The method for fabricating the Fin-FET device according to claim 2, wherein the sacrificial adsorption layer fills up the opening formed in the dielectric layer.

5. The method for fabricating the Fin-FET device according to claim 1, wherein the sacrificial adsorption layer is made of TiAlC.

6. The method for fabricating the Fin-FET device according to claim 5, prior to forming the sacrificial adsorption layer, further including:
    forming a covering layer on the gate dielectric layer; and
    forming the sacrificial adsorption layer on the covering layer.

7. The method for fabricating the Fin-FET device according to claim 6, wherein:
    after performing the second annealing process, the sacrificial adsorption layer is removed; and
    the gate electrode layer is formed on the covering layer.

8. The method for fabricating the Fin-FET device according to claim 6, wherein the covering layer is made of TiN.

9. The method for fabricating the Fin-FET device according to claim 1, wherein:
    the substrate further includes a P-type region and an N-type region;
    the plurality of fin structures are formed in both the P-type region and the N-type region; and
    the opening is formed across the plurality of fin structures in both the P-type region and the N-type region.

10. The method for fabricating the Fin-FET device according to claim 1, wherein the second annealing process is a furnace annealing process with an annealing temperature in a range of 500° C. to 600° C.

11. The method for fabricating the Fin-FET device according to claim 1, wherein the first oxidation layer is formed by a chemical oxidation process, a thermal oxidation process, or an in-situ steam generation process.

12. The method for fabricating the Fin-FET device according to claim 1, wherein the first annealing process is a laser annealing process or a flash annealing process.

13. The method for fabricating the Fin-FET device according to claim 12, wherein:
   a process gas used in the first annealing process includes oxygen gas; and
   an oxygen concentration of the process gas is smaller than 10 ppm.

14. The method for fabricating the Fin-FET device according to claim 1, wherein the gate dielectric layer is made of a high-k dielectric material.

15. The method for fabricating the Fin-FET device according to claim 1, wherein the dielectric layer is formed by a process including:
   forming a dummy gate structure on a portion of the isolation layer and a portion of the sidewall and the top surfaces of the plurality of fin structures, wherein the dummy gate structure is formed across an entire width of each fin structure and the dummy gate structure includes a dummy gate electrode layer;
   forming a source region in each fin structure on one side of the dummy gate structure and a drain region in the fin structure on another side of the dummy gate structure;
   after forming the source region and the drain region, forming a dielectric layer on the isolation layer and an exposed portion of each fin structure, wherein the surface of the dielectric layer is leveled with a top surface of the dummy gate electrode layer; and
   forming an opening in the dielectric layer by removing the dummy gate electrode layer.

16. The method for fabricating the Fin-FET device according to claim 15, wherein:
   the dummy gate structure further includes a dummy gate dielectric layer formed on the sidewall and the top surfaces of the plurality of fin structures; and
   removing the dummy gate dielectric layer after the removal of the dummy gate electrode layer.

17. The method for fabricating the Fin-FET device according to claim 1, wherein forming the gate electrode layer further includes:
   forming a gate electrode film to cover the surface of the dielectric layer and fill up the opening formed in the dielectric layer; and
   forming the gate electrode layer by performing a planarization process on the gate electrode film until the surface of the dielectric layer is exposed.

18. The method for fabricating the Fin-FET device according to claim 17, wherein:
   a work function film is formed on the surface of the dielectric layer and the sidewall and the bottom surfaces of the opening prior to the formation of the gate electrode film; and
   after the planarization of the gate electrode film, a work function layer is formed by planarizing the work function film until the surface of the dielectric layer is exposed.

* * * * *